United States Patent
Fischer et al.

US006324677B1

(10) Patent No.: US 6,324,677 B1
(45) Date of Patent: Nov. 27, 2001

(54) INTEGRATED CIRCUIT LAYOUT DESIGN

(75) Inventors: Wilhelm Carl Fischer, Westfield; Thaddeus John Gabara, Murray Hill, both of NJ (US)

(73) Assignee: Agere Systems Guardian Corp., Murray Hill, NJ (US)

(*) Notice: Subject to any disclaimer, the term of this patent is extended or adjusted under 35 U.S.C. 154(b) by 0 days.

(21) Appl. No.: 09/256,046

(22) Filed: Feb. 23, 1999

(51) Int. Cl.⁷ ..................................................... G06F 17/50
(52) U.S. Cl. ................................................. 716/16; 716/17
(58) Field of Search .................................. 716/12, 16, 17; 257/203, 207

(56) References Cited

U.S. PATENT DOCUMENTS

| | | | | |
|---|---|---|---|---|
| 5,300,796 | * | 4/1994 | Shintani | 257/203 |
| 5,945,696 | * | 8/1999 | Lin et al. | 257/203 |
| 6,058,257 | * | 5/2000 | Nojima | 716/12 |
| 6,071,314 | * | 6/2000 | Baxter et al. | 716/17 |

* cited by examiner

Primary Examiner—Trong Phan
(74) Attorney, Agent, or Firm—Henry T. Brendzel

(57) ABSTRACT

A circuitry layout design allows more functional circuitry to be placed on an integrated circuit by placing functional circuitry on the unused silicon layer of the power I/O strip, which is located in the I/O ring surrounding the core of a processing integrated circuit. The functional circuitry placed on the power I/O strip can be shared by other I/O strips in order to conserve even more space.

13 Claims, 2 Drawing Sheets

INTEGRATED CIRCUIT LAYOUT DESIGN

BACKGROUND OF THE INVENTION

This invention relates to integrated circuit layout design.

Ever since the appearance of the first integrated circuit, artisans have been trying to fit as much circuitry as possible on each integrated circuit. In today's typical layout designs, an integrated circuit contains a central core of functional circuits that is surrounded by an input/output ("I/O") ring of layered semiconductor strips designed to carry signals or power into and out of the integrated circuit. Most of the I/O strips contain circuitry associated with the signals carried through connection pads to and from the processing circuits at the core. A few I/O strips are dedicated to carrying power. See U.S. Pat. No. 3,968,478 issued on Jul. 6, 1976 for an example of such a layout design. As an aside, in order to reduce design time, most designers have developed circuit packages, or circuit cells, that perform a given function, and each individual design is created by selecting, at least for part of the design, from the pre-designed circuit cells. It is such circuit cells that are often found in the core area of the integrated circuit and, particularly, in the I/O strips. In this document, the terms "circuits" and "circuit cells" are used interchangeably because, in the context of this disclosure, it is unimportant whether a previously designed circuit is used, or a specially designed circuit is used.

The distinction between signal-carrying I/O strips and power-carrying I/O strips is that the former do not carry power, and the latter do not contain signal-carrying circuitry, or circuit cells. Although, some embodiments do have power I/O strips which contain circuitry related to the provision of power. Examples of the latter are circuits designed to protect the power bus, or a MOS device of a resistive nature designed to quiet noise on the bus. In any event, the power strip is left with much available space.

Of course, there is no requirement that an integrated circuit layout comprise a core area surrounded by a ring of I/O strips, but it has been found that the use of cells and particularly the use of cell with such a layout arrangement is extremely beneficial to fast and effective design of integrated circuits. While by discarding the core area—I/O ring schema may result in a layout that conserves some space, the incredibly greater amount of time that is required to achieve a layout design is often not cost effective.

SUMMARY OF THE INVENTION

We realized that, at times, the core area—I/O ring schema may be maintained while violating it slightly to obtain some additional space for functional circuitry. Specifically, we realized that there is available space on the power strips that can be effectively utilized for circuit cells that are associated with other than the provision of power. The circuit cells placed on the power strips may be circuit cells that, but for lack of room, might normally be placed in the core area of the integrated circuit, or in a signal I/O strip. When a particular design has a number of signal I/O strips that include circuit cells that can be shared, such as circuit cells that are driven by the same signal, it is possible, and advantageous to replace those circuit cells with a single cell that is placed on a power I/O strip, and to share those I/O cells. This reduces the number of circuit cells employed, and saves space for other functional circuit cells. Thus, a benefit of the disclosed layout design is that more circuitry may be placed on an integrated circuit, effectively without departing from the core area—I/O ring schema.

DETAILED DESCRIPTION OF THE INVENTION

Figure 1:
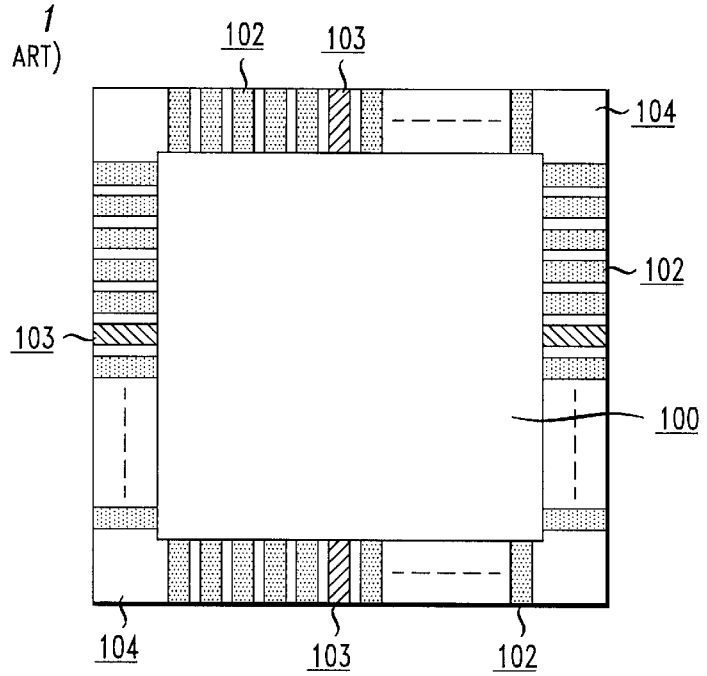
FIG. 1 depicts a prior art integrated circuit layout comprising a core circuit area and an I/O ring which surrounds the core and is made up of strips, some of which carry power and most of which carry signal both into and out of the integrated circuit.

FIG. 1 depicts a prior art integrated circuit layout comprising a processing core, 100, surrounded by a ring of input/output (hereafter "I/O") strips. The I/O ring is made up of many separate I/O strips, 102. Most I/O strips contain functional circuit cells, which process and carry signals between core area 100 and components off the integrated circuit chip via interconnection pads at the edges of the integrated circuit (not shown). At least two I/O strips 103 are reserved for carrying power from a power source off the integrated circuit chip to core area 100. FIG. 1 actually shows four such strips 103, one on each of the four edges of the chip. The disclosed circuitry layout design exploits the power I/O strips by placing functional circuitry on them. It may be pointed out that FIG. 1 shows spaces between strips 102 and spaces between strips 103 and the adjacent strips 102. That is done strictly for purposes of illustration clarity. In actual manufacturing, strips 102 abut each other.

Figure 2:
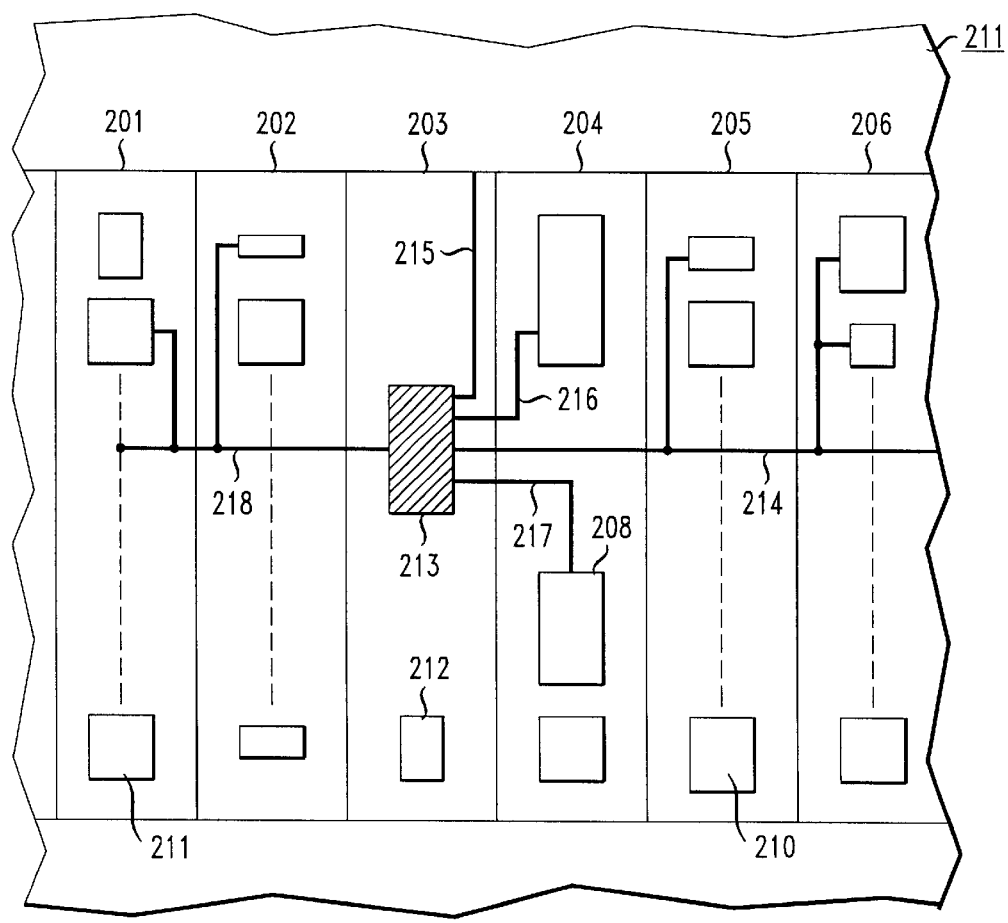
FIG. 2 depicts a number of I/O strips, each with its own circuit cells and a power I/O step that accommodates a circuit cell that is shared by a number of signal I/O cells.

Thus, in accordance with the principles disclosed herein, FIG. 2 depicts a segment of the I/O ring layout where I/O strip 203 is a power I/O strip and I/O strips 201, 202, 204, 205, and 206 are signal I/O strips. Each of the signal I/O strips is shown to contain a number of circuit cells, such as circuit cells 208–211, and power I/O strip 203 is shown to contain a circuit cell 212 that is associated with the provision of the power that I/O strip 203 delivers. Circuit cells 208–211 are the same in the sense that they are functional circuit cells, and may be different with respect to what functional circuitry they contain. Circuit cells 208–211 may be of relatively standard design, taken from a library of circuit cells or they may be custom designs.

In accord with the principles disclosed herein, FIG. 2 includes functional circuitry 213 on power I/O strip 203 that is other than functional circuitry that is associated with the task of strip 203 delivering power to core area 100. As depicted, this functional circuitry receives a signal from core area 100 via lead 215, receives a signal from lead 217, outputs a signal on lead 216 and outputs a different signal on leads 214 and 218. Leads 214 and 218 can carry the same signal. Also as shown, the signal on lead 214 is applied to a plurality of circuit cells; to wit, to circuit cells in strips 205, and 206, and likewise, the signal on lead 218 is applied to circuit cells in strips 201 and 202. The extension of lead 214 to the right aims to suggest that the signal of lead 214 is applied to at least one other cell in some unseen I/O strip.

Circuit cell 213 may contain circuitry that, but for lack of space, might be found in core area 100. Stated in other words, cell 213 was pushed out of core are 100 and into power I/O strip 203. It should be realized, however, that cell 213 could equally be a cell that was pushed out of some other (advantageously adjacent) signal I/O strip. If, fortuitously, a cell is found in a number of signal I/O strips that is driven by the same signal, then such a cell can be pushed into power I/O strip 203 to substantial advantage, because it can then be "shared "by those signal I/O strips. This, of course, would actually save both space on the integrated circuit and power consumed on the integrated circuit.

Figure 3:
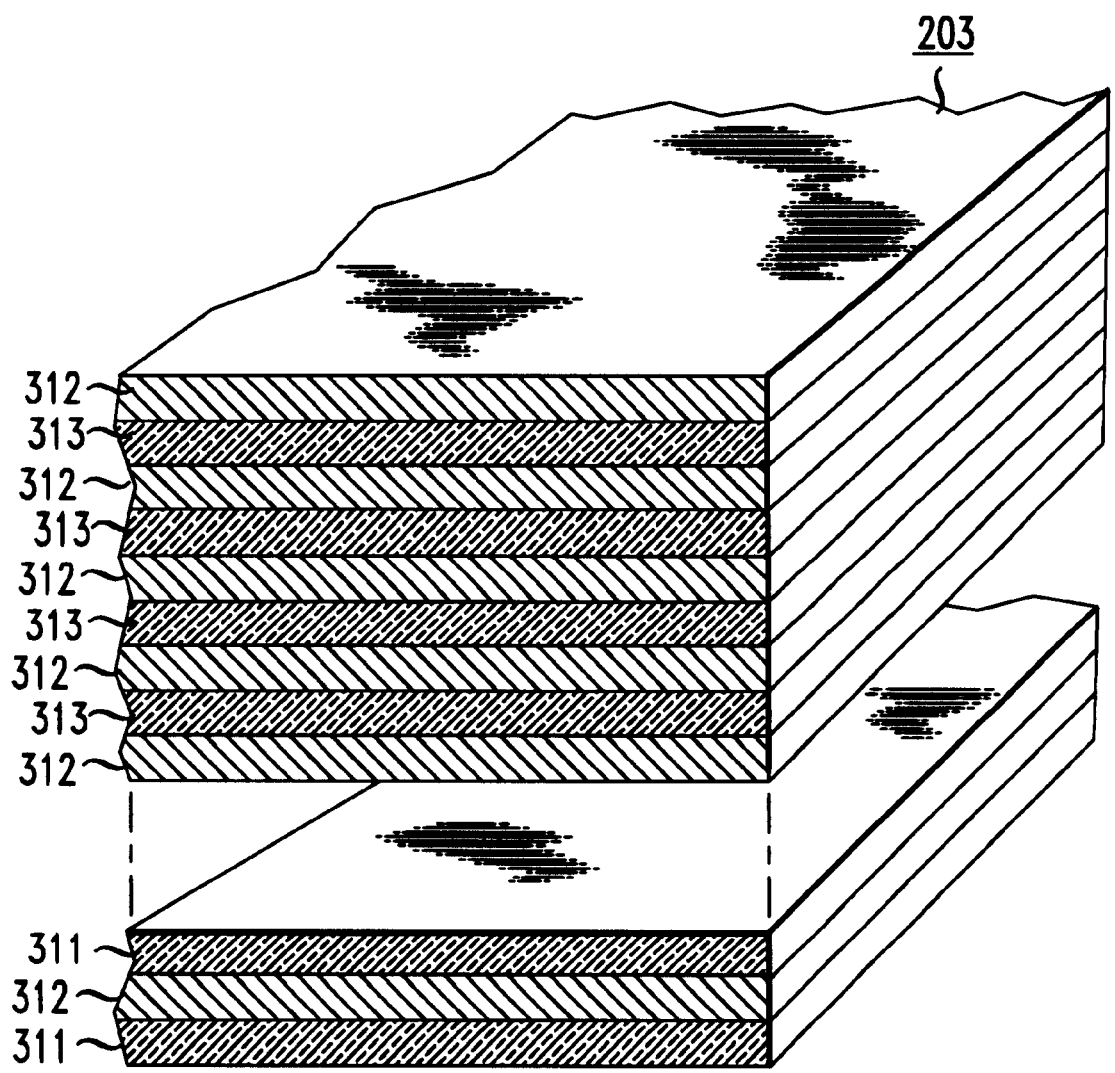
FIG. 3 depicts a cross-section of a power I/O strip.

FIG. 3 depicts the cross-section of an illustrative embodiment of power I/O strip 203 that has 5 active layers. All layers are separated by an oxide layer 312 (cross-hatch upward-to-the-left). Starting from the bottom, it has a thick layer of Silicon (layer 311), and one other silicon layer. The Silicon layer may be used for creating FET channels. Above the thin layer of silicon (and its upper-layer oxide) there is a layer of Polysilicon (layer 312) which, for example, may be used for creating FET transistors. Above the Polysilicon layer (and its upper-layer oxide) there are four metal layers 313 (each separated by an associated oxide layer. The metal layers are used for interconnections of the active elements on strip 203 and, of course, for providing power to core area 100. Illustratively, the layer that provides power to core area 100 is shown in FIG. 3 to be thicker than the lower metal layers.

The above-described embodiments are illustrative of the principles of the present invention. Other embodiments could be devised by those skilled in the art without departing from the spirit and scope of the present invention. For example, a when a number of signal I/O strips contain a cell that is driven by the same signal, and space in one of the signal I/O strips permits installing a version of the power cell that can drive a sufficient number of loads ("beefed up cell"), the cells in the other signal I/O strips can be removed and the beefed up cell can be made to drive the appropriate circuit cells in the other signal I/O strips. Also, there is no reason why the same type of use cannot be made of corner areas 104 (see FIG. 1) of the I/O ring.

We claim:

1. An integrated circuit having a layout that includes a center area with functional circuits thereon, and rectangular I/O strip areas along at least one perimeter of said integrated circuit, where at least one of said I/O strip areas is employed for carrying power to said integrated circuit (power I/O strip) through a conductor embedded in said power I/O strip, while remaining ones of said I/O strip areas are employed for passing signals to and from said integrated circuit and, optionally, processing said signals with signal processing circuits laid out in said I/O strip areas, the improvement comprising:

signal-processing circuitry placed on said power I/O strip that processes signals other than processing signals on said conductor.

2. The integrated circuit of claim 1 where said circuitry receives at least one signal from a circuit laid out on said center area or on one of said remaining ones of said I/O strip areas.

3. The integrated circuit of claim 1 where said circuitry sends a signal to one of said remaining ones of said I/O strip areas.

4. The integrated circuit of claim 1 where said circuitry sends a signal to a plurality of said remaining ones of said I/O strip areas.

5. The integrated circuit of claim 1 where said circuitry is a circuit cell from a collection of circuit-cells.

6. The integrated circuit of claim 1 where said remaining ones of said I/O strips are fully occupied with signal-processing circuits.

7. The integrated circuit of claim 6 where said signal-processing circuits and said signal processing circuitry are circuit cells from a collection of circuit-cells.

8. The integrated circuit of claim 1 where each of said I/O strip areas includes a pad for interfacing functional circuits laid out on said center area, via said signal-processing circuits in those of said I/O strip areas where said signal-processing circuits exist, and via signal paths laid out in those of said I/O strip areas where said signal-processing circuits do not exist.

9. The integrated circuit of claim 1 where said center area is surrounded by said rectangular I/O strip areas.

10. The integrated circuit of claim 9 where said center area is rectangular.

11. An integrated circuit having a layout that includes a center area with functional circuits thereon, and rectangular I/O strip areas along at least one perimeter of said integrated circuit, where at least one of said I/O strip areas is employed for carrying power to said integrated circuit (power I/O strip) through a conductor embedded in said power I/O strip, while remaining ones of said I/O strip areas are employed for passing signals to and from said integrated circuit and, optionally, processing said signals with signal processing circuits laid out in said I/O strip areas, the improvement comprising:

signal-processing circuitry placed on one of said I/O strip areas that provides a signal to signal-processing circuits on a plurality of other I/O strip areas.

12. The integrated circuit of claim 11 where said one of said I/O strip areas is said power I/O strip, or one of said remaining ones of said I/O strip areas.

13. The integrated circuit of claim 11 where said one of said I/O strips areas is a corner area of said integrated circuit.

* * * * *